(12) United States Patent
Forrest et al.

(10) Patent No.: US 9,118,026 B2
(45) Date of Patent: Aug. 25, 2015

(54) ORGANIC SEMICONDUCTORS AS WINDOW LAYERS FOR INORGANIC SOLAR CELLS

(75) Inventors: Stephen R. Forrest, Ann Arbor, MI (US); Ning Li, White Plains, NY (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/232,770

(22) Filed: Sep. 14, 2011

(65) Prior Publication Data

US 2012/0118363 A1    May 17, 2012

Related U.S. Application Data

(60) Provisional application No. 61/382,885, filed on Sep. 14, 2010.

(51) Int. Cl.
| | |
|---|---|
| *H01L 31/07* | (2012.01) |
| *H01L 51/42* | (2006.01) |
| *H01L 31/18* | (2006.01) |
| *H01L 51/00* | (2006.01) |

(52) U.S. Cl.
CPC ............ *H01L 51/4213* (2013.01); *H01L 31/07* (2013.01); *H01L 31/184* (2013.01); *H01L 51/0053* (2013.01); *Y02E 10/544* (2013.01); *Y02E 10/549* (2013.01)

(58) Field of Classification Search
CPC ..... H01L 31/07; H01L 3/184; H01L 51/0053; H01L 51/4213; Y02E 10/544; Y02E 10/549
See application file for complete search history.

(56) References Cited

U.S. PATENT DOCUMENTS

| | | | |
|---|---|---|---|
| 4,106,951 A | 8/1978 | Masi | |
| 4,611,385 A | 9/1986 | Forrest et al. | |
| 5,172,385 A * | 12/1992 | Forrest et al. | 372/50.21 |
| 2007/0131277 A1* | 6/2007 | Gaudiana et al. | 136/258 |
| 2010/0006154 A1* | 1/2010 | Kitazawa et al. | 136/263 |

FOREIGN PATENT DOCUMENTS

FR    2 583 222 A1    12/1986

OTHER PUBLICATIONS

International Search Report from PCT/US2011/051605.

* cited by examiner

*Primary Examiner* — Susan D Leong
(74) *Attorney, Agent, or Firm* — Finnegan, Henderson, Farabow, Garrett & Dunner LLP

(57) ABSTRACT

Disclosed is a device comprising: an anode; a cathode; an inorganic substrate; and at least one organic window layer positioned between: the anode and the inorganic substrate; or the cathode and the inorganic substrate. Also disclosed is a method of enhancing the performance of a photosensitive device having an anode, a cathode, and an inorganic substrate, comprising: positioning at least one organic window layer between the anode and the cathode. In one embodiment the organic window layer may absorb light and generate excitons that migrate to the inorganic where they convert to photocurrent, thereby increasing the efficiency of the device. Also disclosed is a method of enhancing Schottky barrier height of a photosensitive device, the method being substantially similar to the previously defined method.

35 Claims, 11 Drawing Sheets

(a)

(b)

ORGANIC SEMICONDUCTORS AS WINDOW LAYERS FOR INORGANIC SOLAR CELLS

CROSS-REFERENCE TO RELATED APPLICATIONS

This application claims the benefit of U.S. Provisional Application No. 61/382,885, filed Sep. 14, 2010, the disclosure of which is incorporated herein by reference.

STATEMENT REGARDING FEDERALLY SPONSORED RESEARCH

The subject matter of this application was prepared with U.S. Government support under W911NF-08-2-0004 by the Army Research Office. The government has certain rights in the subject matter of this application.

JOINT RESEARCH AGREEMENT

The subject matter of this application was made by, on behalf of, and/or in connection with one or more of the following parties to a joint university-corporation research agreement: University of Michigan and Global Photonic Energy Corporation. The agreement was in effect on and before the date the claimed invention was made, and the claimed invention was made as a result of activities undertaken within the scope of the agreement.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff = \{I_{max}V_{m\ x}^{a}\}/\{I_{SC}V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff*(I_{SC}*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to ½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

Conventional inorganic semiconductor PV cells employ a p-n junction to establish an internal field. Early organic thin film cell, such as reported by Tang, Appl. Phys Lett. 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photo-generation process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F ~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low external quantum efficiency (electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D \sim 50 Å$) than the optical absorption length (~500 Å), requiring a trade-off between using a thick, and therefore resistive, cell with multiple or highly folded interfaces, or a thin cell with a low optical absorption efficiency.

The performance of inorganic solar cells can be enhanced using large bandgap window layers or heterocontact layers, which can be made of lattice matched III-V compounds grown on top of the GaAs and InP solar cells or oxide and other amorphous materials used for silicon solar cells. These layers can improve solar cell photo current and open circuit voltage in both Schottky barrier and PN junction type devices The materials currently used for the window layers or hetero-contact layers have been limited to inorganic semiconductors and dielectrics. There is disclosed herein using conducting organic materials as the window layer for inorganic solar cells. Previously, the growth kinetics and junction characteristics of organic molecules on inorganic substrates have been thoroughly investigated. It is also shown that organic materials can passivate the inorganic material surfaces, reduce the dark current for photo detectors, and serve as gate dielectrics for transistors. Researchers are also trying to use inorganic hybrid junctions for solar cell applications. However, the goal is adding inorganic materials into the organic matrix to help the exciton dissociation and charge collection. Using organic materials as window layers to improve inorganic solar cell performance has not been demonstrated.

Due to the surface passivation effect and large variety of energy levels of organic materials, they are very suitable for window layer applications for inorganic solar cells. As discussed herein, there is disclosed 3,4,9,10-Perylenetetracarboxylic dianhydride (PTCDA) as the window layer for InP Schottky barrier solar cells. Previously, it was shown that PTCDA molecules lie flat and can grow into uniform thin films on inorganic semiconductor surfaces and can also enhance the Schottky barrier heights in many cases. As discussed in more detail below, a thin layer of PTCDA can enhance the open circuit voltage and the power conversion efficiency of the InP solar cells.

SUMMARY OF THE INVENTION

The present disclosure relates to a device comprising: an anode; a cathode; an inorganic substrate; and at least one organic window layer. In one embodiment, the device comprises at least one inorganic epilayer. The organic window layer disclosed herein is positioned between the anode and cathode, such as between an inorganic semiconductor layer and a contact, including between the anode and the at least one inorganic epilayer. In one embodiment, the disclosed device exhibits one or more of the following characteristics when compared to the device without the at least one organic window layer: increased $V_{OC}$ at one sun AM1.5G illumination; increased power conversion at one sun AM1.5G illumination; enhanced Schottky barrier height; or reduced forward dark current.

There is also disclosed a method of enhancing the performance of a photosensitive device having an anode, a cathode, an inorganic substrate, and at least one inorganic epilayer, the method comprising: positioning at least one organic window layer between said anode and said at least one inorganic epilayer.

In addition, there is disclosed a method of enhanced Schottky barrier height of a photosensitive device comprising an anode, a cathode, an inorganic substrate, and at least one inorganic epilayer, the method comprising: positioning at least one organic window layer between the anode and the at least one inorganic epilayer.

The foregoing and other features of the present disclosure will be more readily apparent from the following detailed description of exemplary embodiments, taken in conjunction with the attached drawings. It will be noted that for convenience all illustrations of devices show the height dimension exaggerated in relation to the width.

DETAILED DESCRIPTION OF THE INVENTION

Figure 1:
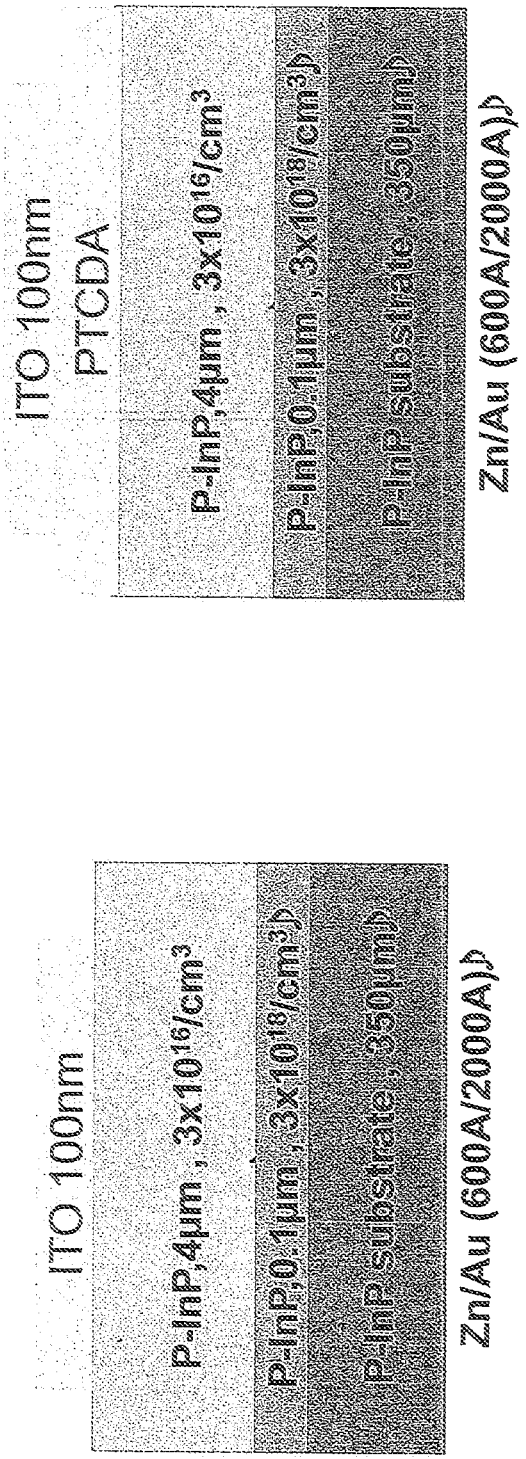
FIG. 1. is a schematic showing layer structures of p-InP Schottky barrier solar cells with 4 μm-thick lightly doped absorption region, without 3,4,9,10-Perylenetetracarboxylic dianhydride (PTCDA) contact interfacial layer (a) and with PTCDA interfacial layer (b).

As used herein, photosensitive optoelectronic devices can be solar cells, particularly Schottky barrier solar cell.

As used herein, the term "organic" includes polymeric materials as well as small molecule organic materials that may be used to fabricate organic photosensitive optoelectronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

It is also appreciated that the organic materials described herein, whether polymeric materials or small molecule organic materials, may comprise organic semiconductors, of either p-type or n-type.

As used herein, the term "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

The terms "electrode" and "contact" are used herein to refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by for its disclosure of electrodes, provides examples of electrodes, or contacts, which may be used in a photosensitive optoelectronic device.

In a photosensitive optoelectronic device, it may be desirable to allow the maximum amount of ambient electromagnetic radiation from the device exterior to be admitted to the photoconductively active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least about 50% of the ambient electromagnetic radiation in relevant wavelengths to be transmitted through the layer or layers. Similarly, layers which permit some, but less than about 50% transmission of ambient electromagnetic radiation in relevant wavelengths are said to be "semi-transparent."

The term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner. It will be noted that as the terms are used herein, anodes and cathodes may be electrodes or charge transfer layers.

As used herein, "top" means furthest away from the substrate structure (if present), while "bottom" means closest to the substrate structure. If the device does not include a substrate structure, then "top" means furthest away from the reflective electrode. For example, for a device having two electrodes, the bottom electrode is the electrode closest to the substrate structure, and is generally the first electrode fabricated. The bottom electrode has two surfaces, a bottom side closest to the substrate, and a top side further away from the substrate. Where a first layer is described as "disposed over" or "on top of" a second layer, the first layer is disposed further away from substrate. There may be other layers between the first and second layer, unless it is specified that the first layer is "in physical contact with" the second layer. For example, a cathode may be described as "disposed over" or "on top of" an anode, even though there are various organic layers in between.

It is appreciated that one does not have to have the light incident from the surface. Rather, it can be incident from the substrate side if there is an aperture (window) in the back metal contact. In other words, the top contact can be opaque such that the device has an inverted structure. In this embodiment, the substrate needs to be transparent to the light that is absorbed in the epilayer. The top contact can also be a thin metal that is semitransparent, if light is incident on the top surface. It can also be any one of a number of transparent conducting oxides (TCO). In some embodiments, the transparent conducting oxide is chosen from transparent oxides and metal or metal substitutes having a thickness sufficient to render them transparent or semi-transparent. In some embodiments, the transparent electrode is selected from transparent conducting oxides such as indium tin oxide (ITO), gallium indium tin oxide (GITO), fluorine doped tin oxide ($SnO_2$:F or FTO), and zinc indium tin oxide (ZITO).

The present disclosure relates to a device comprising: two contacts, typically referred to as an anode and a cathode, an inorganic substrate, such as a semiconductor substrate, and at least one organic window layer positioned between at least one contact and the inorganic substrate. It is appreciated that the organic window layer may be deposited directly on the substrate, or onto an inorganic epilayer that is on top of the substrate.

Thus, while the organic window layer is broadly described as being positioned between the anode and cathode, it can specifically be described as being positioned either between the anode and the inorganic substrate, or between the cathode and the inorganic substrate. When an inorganic epilayer is present, the organic window layer is positioned between the previously mentioned contacts (either the anode or cathode) and the inorganic epilayer.

In one embodiment the organic window layer may absorb light and generate excitons that migrate to the inorganic where they convert to photocurrent. By this mechanism, the efficiency of the device is further increased.

FIG. 1 shows a p-InP Schottky barrier solar cell according to the present invention. In this embodiment, layer structures of p-InP Schottky barrier solar cells are shown in cross-section, with 4 μm-thick lightly doped absorption region, without 3,4,9,10-Perylenetetracarboxylic dianhydride (PTCDA) contact interfacial layer (a) and with PTCDA interfacial layer (b).

Figure 2:
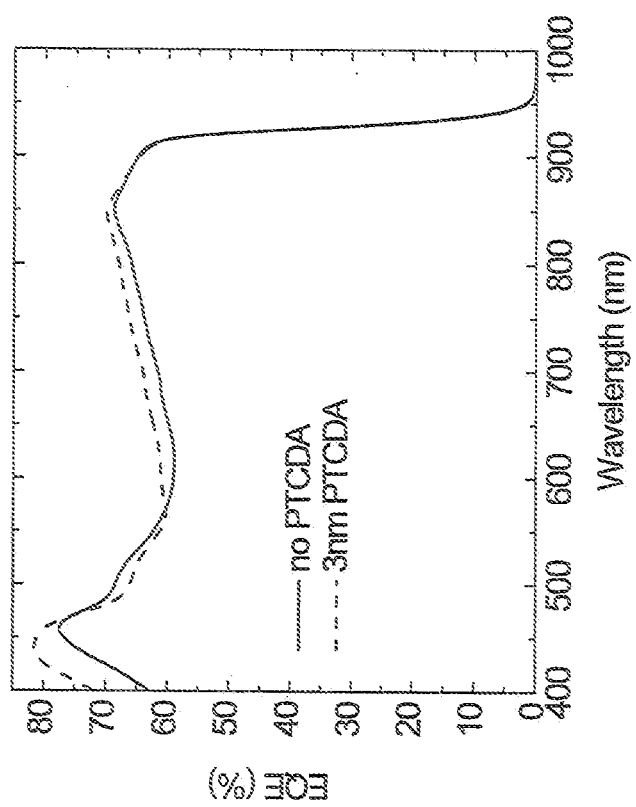
FIG. 2. is a graph showing the measured external quantum efficiency (EQE) of InP Schottky barrier solar cell without and with 3 nm PTCDA contact interfacial layer.
Figure 3:
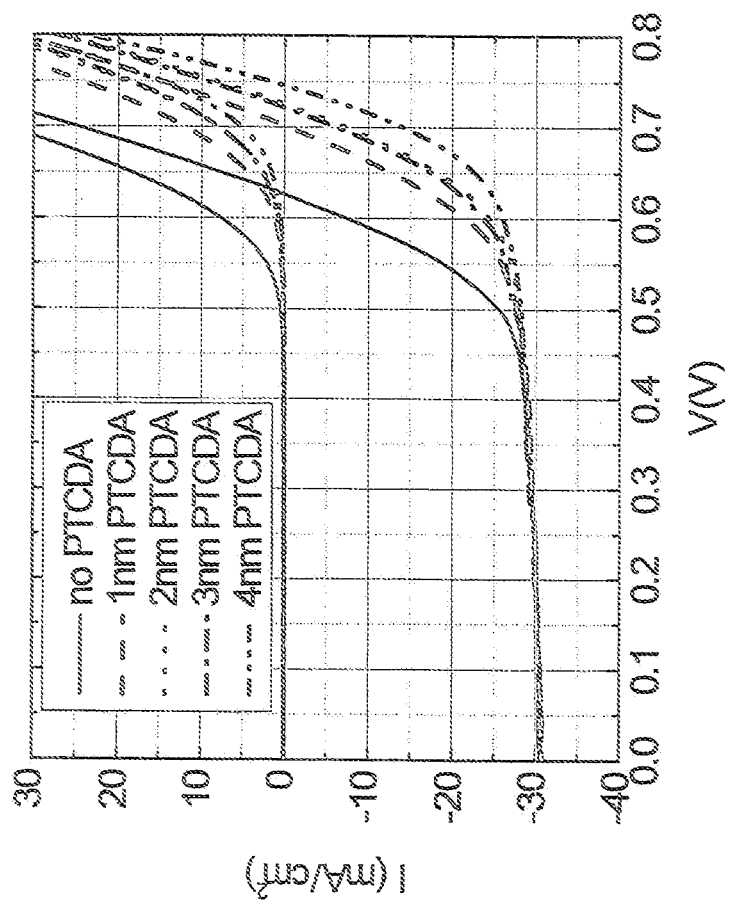
FIG. 3. is a graph showing the measured current-voltage characteristics of InP Schottky barrier solar cell with different PTCDA layer thicknesses under dark and one sun AM1.5G condition FIG. 4. is a graph showing measured open circuit voltage at various solar illumination power intensity of InP Schottky barrier solar cell with different PTCDA layer thicknesses FIG. 5. is a graph showing power conversion efficiency at various solar illumination power intensity of InP Schottky barrier solar cell with different PTCDA layer thicknesses FIG. 6. is a schematic showing layer structure (a) and a graph showing current-voltage characteristics (b) of p-InP Schottky barrier solar cells with a 2:m-thick InP lightly doped absorption region FIG. 7. is a graph showing measured energy level diagram at the InP-PTCDA junction with ultraviolet photoemission spectroscopy. The energy unit of the number labeled is eV.
Figure 4:
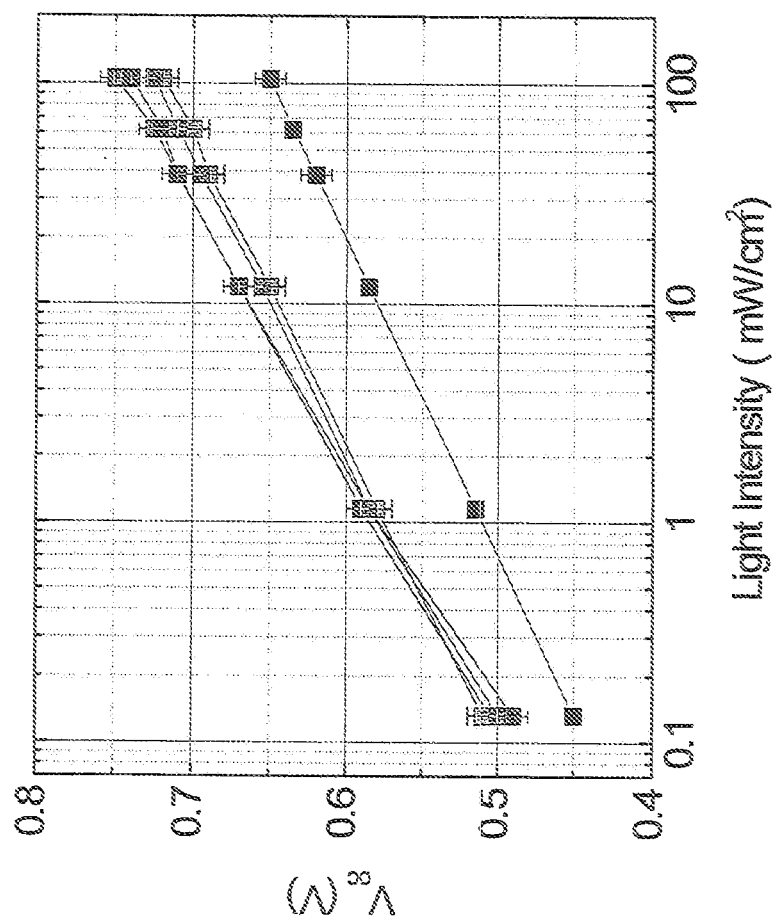
Figure 5:
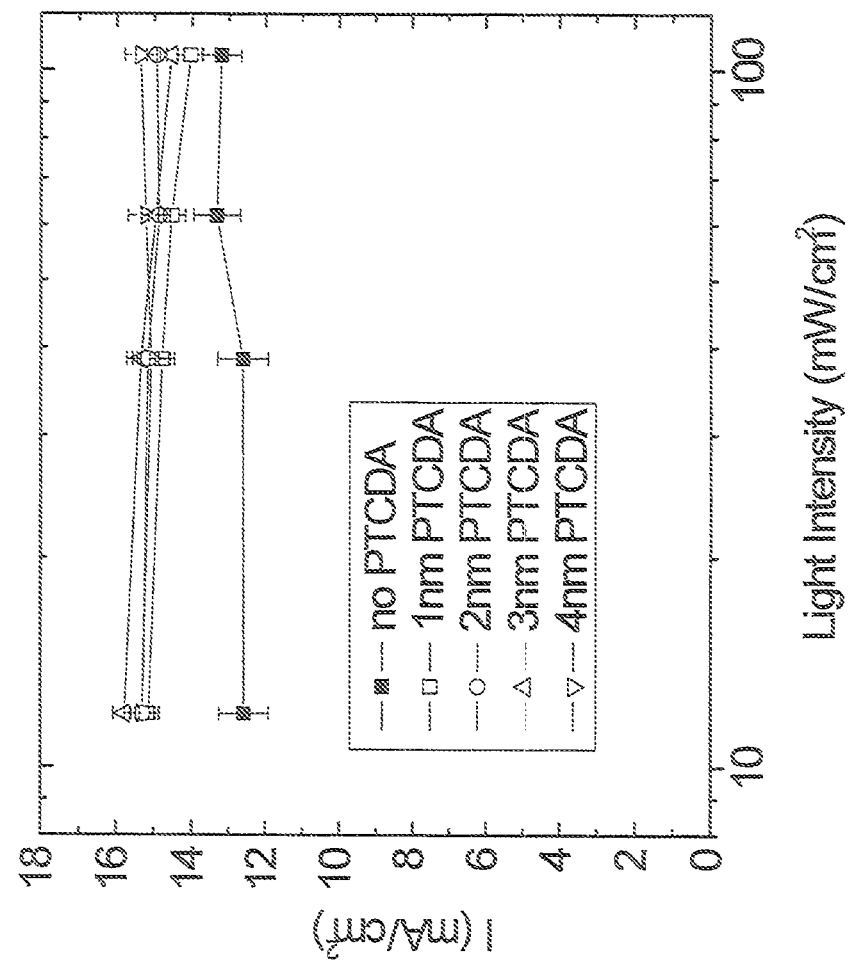

FIG. 2 shows that the measured EQE versus the wavelength for the devices with 3 nm PTCDA layer and without the PTCDA layer are very similar over the spectrum range from 400 nm to 950 nm. FIG. 3 shows the current-voltage characteristics of InP solar cells with various PTCDA layer thicknesses under dark and one sun illumination. All devices show very similar photocurrent, which is consistent with the similar measured EQE profiles. However, there is a distinct difference in the open circuit voltage ($V_{OC}$) between the devices without and with the PTCDA window layer. $V_{OC}$ of the devices without PTCDA is 0.65V; while $V_{OC}$ of the devices with 4 nm PTCDA layer is enhanced to 0.75V, at one sun illumination. The open circuit voltage versus the illumination light intensity is plotted in FIG. 4, which shows that the $V_{OC}$ of the devices with PTCDA is higher at all illumination intensities comparing with the device without PTCDA layer. Since there is no degradation in fill factors in all devices with PTCDA window layers, the power conversion efficiency is enhanced concomitantly from 13.2±0.5% for devices without PTCDA to 15.4±0.4% for devices with 4 nm PTCDA (FIG. 5) at one sun AM1.5G illumination.

Figure 6:
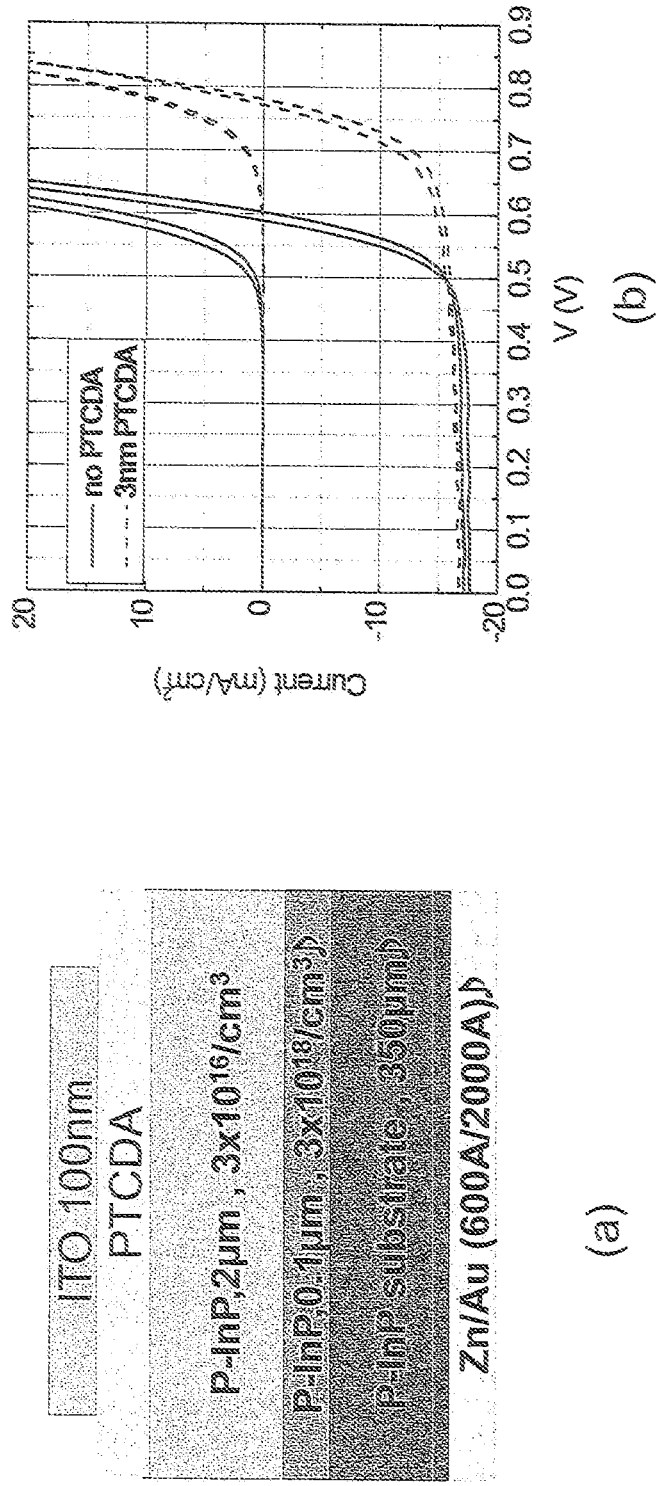

Another set of current-voltage curves for an InP Schottky barrier solar cell with thinner (2 μm) lightly doped absorption layer (FIG. 6 (a) is shown in FIG. 6 (b)). The open circuit voltage of the device is enhanced from 0.62V for devices without PTCDA to 0.78V for devices with 3 nm PTCDA window layer under one sun illumination.

Figure 7:
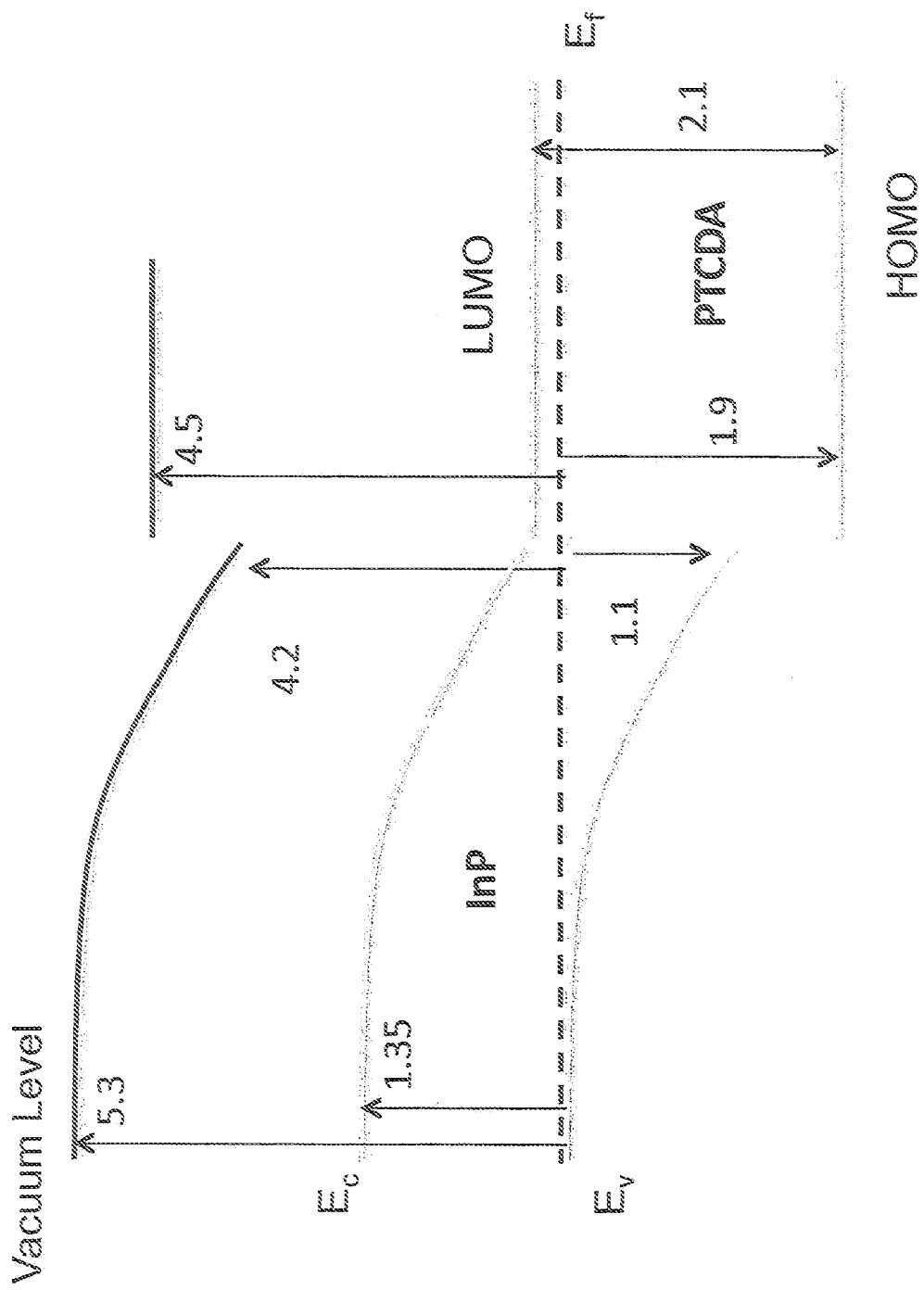

The reasons for the $V_{OC}$ enhancement with window layers are manifold. To understand the function of PTCDA layer, we measured the energy levels at the InP-PTCDA interface using Ultraviolet Photoelectron Spectroscopy (UPS), FIG. 7 shows the measured energy level diagram. The vacuum level is shifted by 0.3 eV at the InP-PTCDA interface due to a small interface dipole. The difference between the lowest unoccupied molecular orbital (LUMO) energy level of PTCDA and the InP conduction band edge ($E_C$) is smaller than 0.1 eV. The discontinuity between the valence band edge ($E_V$) of InP and the highest occupied molecular orbital (HOMO) energy level of PTCDA is 0.8 eV.

With this measured energy level alignment, the holes must overcome a large energy barrier to go from InP to PTCDA, while the electron conduction is not impeded at the InP-PTCDA interface. As a result, the Schottky diode forward biased dark current due to hole thermionic emission over the Schottky barrier from InP to ITO will be suppressed. Instead, the forward biased dark current is mainly the bulk and interface recombination current of holes in InP and electrons injected from ITO. The suppression of the forward dark current leads to the enhancement of $V_{OC}$.

The hole energy barrier introduced by the PTCDA layer also helps to collect the photo-generated carriers at the right electrode, i.e., directing photo-generated holes to the $p^+$-InP substrate instead of ITO electrode. This effect may not be significant at zero bias since there is a large built-in electric field in the device to collect the charged carriers. However, at voltages near to $V_{OC}$, when the built-in field in the device is much lower, the photo-generated holes can diffuse to ITO contact and results in the loss of photo current. The PTCDA hole energy barrier can direct the hole diffusion to the $p^+$-InP substrate, which enhances the photo current near $V_{OC}$ as observed in the current-voltage characteristics. It also can pull the I-V curves down into the fourth quadrant and contributes to the enhancement of $V_{OC}$.

Figure 8:
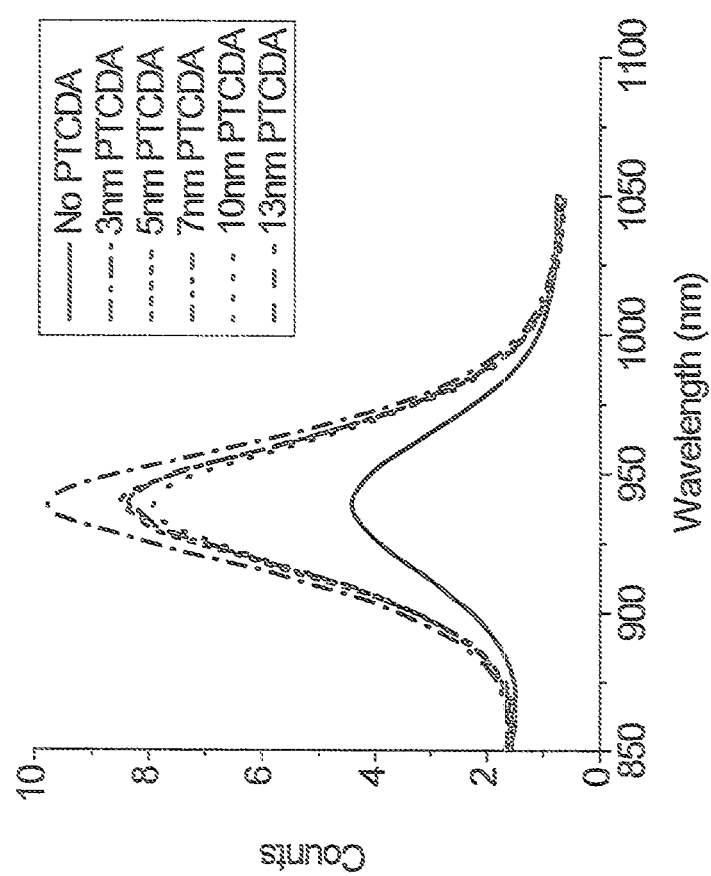
FIG. 8. is a graph showing measured photoluminescence of p-InP substrate without and with PTCDA capping layers of various thicknesses.

Another important parameter for a solar cell is the surface recombination velocity or carrier lifetime. To qualitatively compare the carrier surface recombination lifetime, we measured the Photoluminescence (PL) of the InP films with and without PTCDA capping layers at exactly the same condition. The results are plotted in FIG. 8. It is observed that the PL of the wafer with PTCDA capping layer is significantly higher than the wafer without, which indicates a much longer carrier lifetime. The reduction of carrier recombination and enhancement of carrier lifetime are essential in achieving high open circuit voltage.

The change in the Schottky barrier height may also contribute to the $V_{OC}$ enhancement. It has been shown that the effective Schottky barrier height is enhanced when using PTCDA interfacial layer on p-InP Schottky diodes. From our analysis, the $V_{OC}$ enhancement of p-InP Schottky barrier solar cells with PTCDA window layers is a result of multiple factors.

In the broadest sense, there is disclosed a device, such as a Schottky barrier solar cell, comprising: an anode; a cathode; an inorganic substrate; and at least one organic window layer positioned between the anode and the cathode.

In one embodiment, the device described herein exhibits one or more of the following characteristics when compared to the device without said at least one organic window layer: increased $V_{OC}$ at one sun AM1.5G illumination; increased power conversion at one sun AM1.5G illumination; enhanced Schottky barrier height; and reduced forward dark current.

In one embodiment, the device described herein further comprises at least one inorganic buffer layer positioned between the inorganic substrate and the at least one inorganic epilayer.

In one embodiment, the anode of the described device comprises a transparent conducting material, such as the transparent conducting oxide indium tin oxide (ITO). In some embodiments, the transparent conducting oxide is chosen from transparent oxides and metal or metal substitutes having a thickness sufficient to render them transparent or semi-transparent. In some embodiments, the transparent electrode is selected from transparent conducting oxides such as indium tin oxide (ITO), gallium indium tin oxide (GITO), fluorine doped tin oxide ($SnO_2$:F or FTO), and zinc indium tin oxide (ZITO).

In one embodiment, the cathode of the described device comprises one or more materials selected from Zn, Au, Al, Ag, alloys thereof, and stacks thereof. For example, the cathode may comprise Zn/Au.

In another embodiment, the inorganic substrate comprises a material selected from Ge, Si, GaAs, InP, GaN, AlN, CdTe, and combinations thereof. Other materials that may be used include copper indium gallium (di)selenide (CIGS). In one embodiment, the inorganic substrate may comprise a p-type InP.

The inorganic epilayer may comprise the same materials listed above for the inorganic substrate, including Ge, Si, GaAs, InP, GaN, AlN, CdTe, and combinations thereof. Other materials that may be used include copper indium gallium (di)selenide (CIGS).

In another embodiment, the at least one inorganic buffer layer comprises at least one III-V material, such as at least one material selected from GaAs and InP.

As previously stated, the at least one organic window layer may comprise 3,4,9,10-Perylenetetracarboxylic dianhydride (PTCDA) or naphthalene tetracarboxylic anhydride (NTCDA). In some embodiments, these crystalline organics can be any organic semiconductor (including polymers) that are semitransparent to the wavelengths of interest; are p-type or n-type conducting; and/or increase the barrier height of the p or n-type substrate. Non-limiting examples include poly(3-hexylthiophene) (P3HT), phenyl-$C_{61}$-butyric acid methyl ester (PCBM), subphthalocyanine (SubPc), squaraine, and copper phthalocyanine (CuPc), tin phthalocyanine (SnPc).

The least one organic layer has a thickness up to 25 nm, such as up to 10 nm.

There is also disclosed a method of enhancing the performance of a photosensitive device having an anode, a cathode, an inorganic substrate, and at least one inorganic epilayer, the method comprising: positioning at least one organic window layer between the anode and the at least one inorganic epilayer.

The method of enhancing the performance of a photosensitive device is evidenced by the device as exhibiting one or more of the following characteristics when compared to the device without said at least one organic window layer: increased $V_{OC}$ at one sun AM1.5G illumination; increased power conversion at one sun AM1.5G illumination; enhanced Schottky barrier height; and reduced forward dark current.

The method described herein comprises at least one inorganic buffer layer positioned between the inorganic substrate and the at least one inorganic epilayer.

In one embodiment, the anode comprises one or more materials selected from ITO, alloys thereof, and stacks thereof.

In another embodiment, the cathode comprises any material sufficient to make ohmic contact with the semiconductor material, such as a metal selected from Zn, Au, Al, alloys thereof, and stacks thereof.

In one embodiment, the inorganic substrate comprises a material selected from Ge, Si, GaAs, InP, GaN, AlN, CdTe, and combinations thereof. Other materials that may be used the inorganic substrate include copper indium gallium (di) selenide (CIGS).

In one embodiment, the at least one inorganic epilayer comprises at least one III-V material, such as at least one material selected from GaAs and InP.

In one embodiment, the at least one inorganic buffer layer comprises at least one III-V material, the at least one inorganic buffer layer comprises at least one material selected from GaAs and InP.

In one embodiment, the at least one organic window layer comprises 3,4,9,10-Perylenetetracarboxylic dianhydride (PTCDA) or naphthalene tetracarboxylic anhydride (NTCDA).

The at least one organic layer has a thickness up to 10 nm.

There is also disclosed herein a method of enhancing Schottky barrier height of a photosensitive device comprising an anode, a cathode, an inorganic substrate, and at least one inorganic epilayer, the method comprising:

positioning at least one organic window layer between the anode and the at least one inorganic epilayer, wherein the device exhibits one or more of the following characteristics when compared to the device without the at least one organic window layer: increased $V_{OC}$ at one sun AM1.5G illumination; increased power conversion at one sun AM1.5G illumination; and reduced forward dark current.

The embodiments described herein are further illustrated by the following non-limiting example.

EXAMPLE

The epitaxial solar cell structure was grown by gas source molecular beam epitaxy on a p-type, Zn-doped (100) InP substrate. The epitaxial structure consisted of a 0.1 μm thick, Be doped ($3 \times 10^{18}$ cm$^{-3}$) p-type InP buffer layer and a 4 μm thick lightly Be doped ($3 \times 10^{16}$ cm$^{-3}$) p-type InP absorption layer.

The epitaxial wafer was then fabricated into Schottky barrier solar cells both without PTCDA window layer and with PTCDA window layer. Right before the device processing, the surface of the InP epi-wafer was treated with one minute of NR$_4$OH dip to remove the native oxide.

To make the conventional InP Schottky barrier solar cells, indium-tin-oxide (ITO) electrode was directly sputtered on top of the surface-treated InP epi-wafer to form the structure shown in FIG. 1(a). To make the devices with PTCDA window layer, a thin layer of PTCDA was deposited first using vacuum thermal evaporation on the surface-treated InP epi-wafer. ITO electrode was then sputtered on top of the PTCDA layer under to form the device structure shown in FIG. 1(b). The PTCDA material used in the device was purified three times using sublimation train purification method before the deposition.

Following growth, the epitaxial wafer was cleaned by sequential immersion for 5 min in acetone, isopropanol maintained at 140° C., and then for 1 min in 25% NH$_4$OH:H$_2$O to remove the native oxide. The back contact consisted of 20 nm Pd/5 nm Zn/20 nm Pd/200 nm Au, and then alloyed at 400° C. for 1 min. Conventional InP Schottky barrier solar cells were fabricated by ITO sputter deposition through a shadow mask with 1 mm-diameter circular openings. The deposition rate was 0.1 Å/sec for the first 100 Å, and then increased to 0.3 Å/sec to achieve a total thickness of 1000 Å. The PTCDA source material was purified three times by sublimation prior to deposition. Window layers from δ=1 nm to 30 nm thick were deposited by vacuum thermal evaporation at a rate of 1 Å/sec in a high vacuum chamber with a base pressure <$2 \times 10^{-6}$ Torr. The ITO sputter deposition rate and thickness for window layer devices were similar to those used for the ITO/InP diodes.

The energy level alignment at the OI interface was measured using ultraviolet photoemission spectroscopy (UPS) and X-ray photoemission spectroscopy (XPS). Photoluminescence (PL) data were obtained using a spectrofluorometer at incident and detection angles of 45°. The diode external quantum efficiency (EQE) was obtained using a monochromator, a lock-in amplifier, and a tungsten-halogen illumination source whose intensity was referenced to a calibrated Si photodetector. The current density (J) versus voltage (V) characteristics were measured using a semiconductor parameter analyzer in the dark and under simulated AM1.5G illumination. The illumination intensity was calibrated using a National Renewable Energy Laboratory Si reference solar cell.

Figure 9:
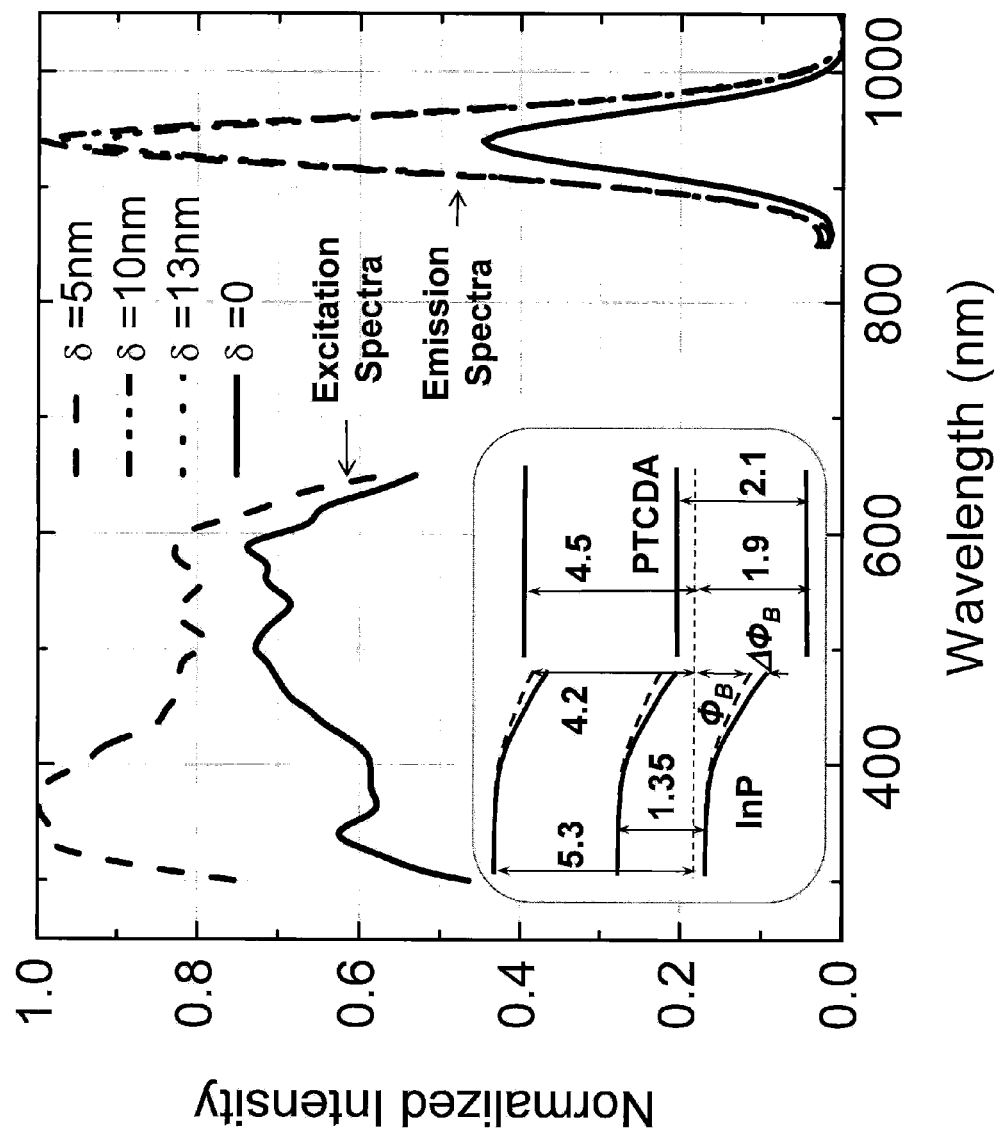
FIG. 9. is a graph showing photoluminescence (excitation at λ=409 nm), and excitation (emission at λ=930 nm) spectra of an p-InP epitaxial wafer, and the of the same wafer with various thicknesses (δ) of 3,4,9,10-Perylenetetracarboxylic dianhydride (PTCDA) capping layer. Inset: Energy levels of p-InP and PTCDA inferred from ultra-violent photoemission spectroscopy. Units of eV are applied to the numbers in the inset.

FIG. 9 shows the PL and excitation spectra of the InP epitaxial layers with and without PTCDA windows. It was observed that the InP PL intensities of the PTCDA-coated samples are more than double that of bare InP. Now, the PL quantum efficiency $\eta_{PL}$ is expressed as: $\eta_{PL} \propto k_{rad}/(k_{rad}+k_{nr}+k_s)$, where $k_{rad}$ is the radiative recombination rate, $k_{nr}$ is the non-radiative recombination rate in the bulk of semiconductor, and $k_s$ is the non-radiative surface recombination rate. Since short wavelength (λ=409 nm) optical excitation as used in FIG. 9 primarily impacts the filling of surface and near-surface defects, the enhanced PL indicates a reduced $k_s$. Specifically, the spectrally dependent absorption of InP suggest that the absorption length in InP at λ=900 nm is ~1 μm, while at λ=400 nm it is only ~20 nm.

When PTCDA is deposited on InP surface, holes are injected from the PTCDA, thereby neutralizing negatively charged traps at the InP surface. This increases $ø_B$, as shown in FIG. 9, inset. As a result, the active surface trap density that accounts for the non-radiative surface recombination is reduced.

The conclusion that PTCDA reduces surface recombination is confirmed by the excitation spectra, which show that the PL intensity enhancement is significantly larger at short (λ<420 nm) than at long wavelengths (λ>580 nm), particularly when we note that δ=5 nm PTCDA may attenuate the excitation signal in the short wavelength region. It is also observed that the PL intensity of the PTCDA-capped samples increases slightly with illumination over time, indicating that surface trap filling of the deepest levels takes several minutes to complete.

The energy level diagram of the PTCDA/InP interface, inferred from UPS data, is shown in the inset of FIG. 9. As-grown p-InP exhibits a surface vacuum level at 4.2±0.1 eV relative to $E_F$, whereas the PTCDA deposited on InP has a vacuum level at 4.5±0.1 eV. The energy band bending at the InP surface is shown both before (dashed line, $ø_B$=1.1±0.1 eV), and after PTCDA deposition (solid line, $ø_B'=ø_B+\Delta ø_B$). Here, $\Delta ø_B$ is the incremental increase in barrier height that results from the change in surface state charge on deposition of the PTCDA. After depositing 5 Å PTCDA, In 3d peak in InP XPS spectrum was shifted by 20 meV towards higher binding energy with respect to Fermi level, which indicates more surface band bending and $\Delta ø_B$ is on the order of 20 meV. Since the highest occupied molecular orbital (HOMO)

energy level of PTCDA is 1.9±0.1 eV below $E_F$, the discontinuity between the valence band maximum of InP and the PTCDA HOMO is $(0.8-\Delta\phi_B)$ eV. The energy difference between the lowest unoccupied molecular orbital (LUMO) energy level of PTCDA and the InP conduction band minimum is negligible. As a result, the photogenerated electrons in window layer cells are transported from InP to the ITO electrode through the PTCDA without encountering an energy barrier.

Figure 10:
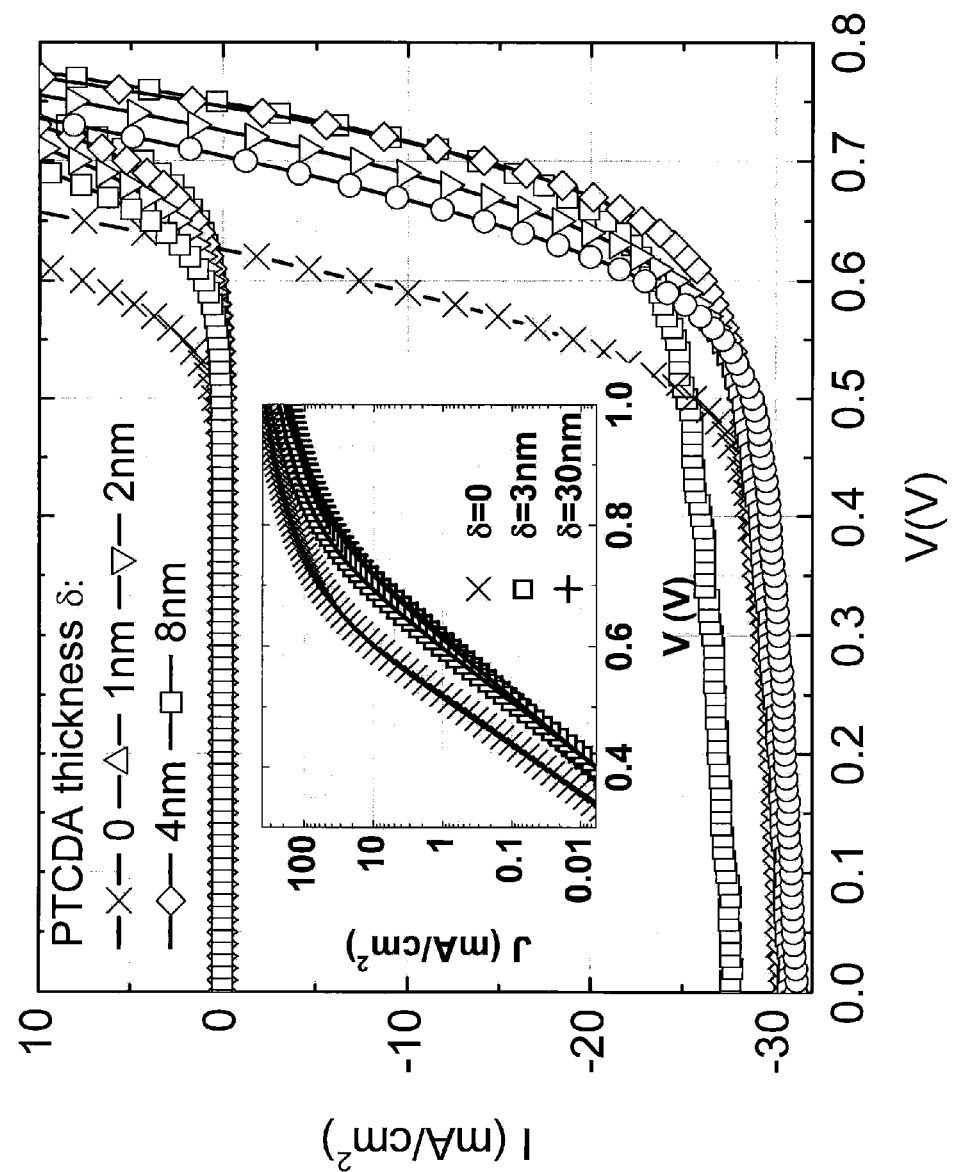
FIG. 10. is a graph showing current density-voltage (J-V) characteristics of p-InP/PTCDA solar cells with PTCDA window layer thicknesses of δ=0, 1 nm, 2 nm, 4 nm, and 8 nm. Inset: Measured (symbols) and fit (lines) dark J-V characteristics of p-InP/PTCDA solar cells with δ=0, 3 nm, and 30 nm.

FIG. 10 shows the J-V characteristics of InP solar cells with various δ in the dark, and under one sun, AM1.5G illumination. All devices with δ≤4 nm show similar photocurrent densities. However, $V_{OC}$=0.62±0.3V for devices without PTCDA (δ=0), while $V_{OC}$=0.75±0.3V for those with δ=4 nm. The power conversion efficiency is correspondingly increased from 13.2±0.5% for δ=0 to 15.4±0.4% for those with δ=4 nm.

The forward J-V characteristics are fit using:

$$J = J_s\left[\exp\left\{q\frac{V-JR_s}{nkT}\right\}-1\right].$$

The fits, shown in FIG. 10 inset, yield the diode ideality factor, n, the specific series resistance, $R_S$, and the saturation dark current, $J_S$, as listed in Table I together with the measured $V_{OC}$.

It has been shown that the OI interface can be modeled as a semiconductor heterojunction to yield $$J_s = J_{s,0}\exp\left(-\frac{\Delta\phi_B}{kT}\right),$$

where $J_{s,0}$ is the saturation dark current of the device without a PTCDA window layer. Assuming a short circuit photocurrent density of $J_{SC}$, we can write the $V_{OC}$ as:

$$V_{OC} = \frac{nkT}{q}\ln\left[\frac{J_{SC}}{J_s}\right] = \frac{nkT}{q}\ln\left[\frac{J_{SC}}{J_{s,0}}\right] + n\Delta\phi_B$$

In InP-PTCDA devices, the increase in $V_{OC}$ is due to both a reduced $J_S$ and an increased n. The reduction in $J_S$ results from the increased Schottky barrier height with PTCDA deposition. The increased n is attributed to a reduced forward bias voltage across InP due to the drop across PTCDA. Note that $R_S$ does not increase with the increased δ, resulting in the same fill factor for devices with and without PTCDA.

TABLE I

Dark current fitting parameters

| δ (nm) | n | $R_s$ ($\Omega \cdot cm^2$) | $J_s$ ($\times 10^{-10} A/cm^2$) | $V_{oc}$ (V) |
|---|---|---|---|---|
| 0 | 1.31 | 0.80 | 4.8 | 0.62 |
| 1 | 1.43 | 1.3 | AM1.5 | 0.71 |
| 3 | 1.47 | 0.86 | AM1.5 | 0.75 |
| 5 | AM1.56 | 0.75 | 4.0 | 0.75 |
| 10 | AM1.56 | 0.83 | 2.6 | 0.76 |
| 30 | AM1.59 | 1.0 | 3.6 | 0.76 |

Figure 11:
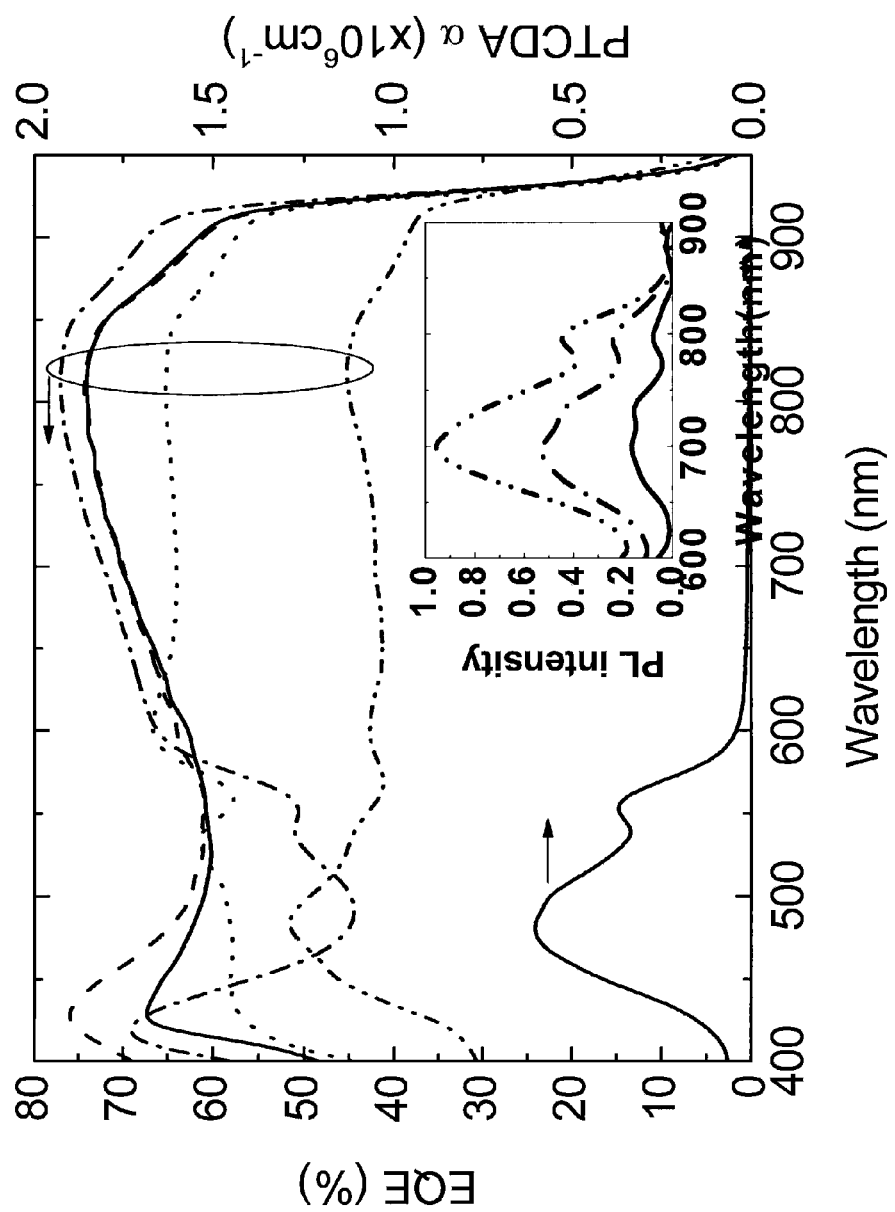
FIG. 11. is a graph showing external quantum efficiency (EQE) versus wavelength for p-InP/PTCDA solar cells with PTCDA layer thicknesses of δ=0 (solid line), 3 nm (dash), and 10 nm (dot). The PTCDA absorption spectrum is shown as a reference. The EQE of devices with 24 nm thick bathocuproine (BCP) (dash dot) and 30 nm $MoO_3$ (dash dot dot) exciton blocking layers (EBLs) between PTCDA and ITO are also shown. Inset: Photoluminescence of PTCDA in the Quartz/PTCDA/exciton blocking layer (EBL)/ITO structures with no EBL (solid line), with 12 nm BCP (dash dot), and with 30 nm $MoO_3$ (dash dot dot).

FIG. 11 shows EQE versus λ for various δ. For δ<3 nm, the EQE is close to that of the ITO/InP solar cell at λ>500 nm. However, at shorter wavelengths, the EQE for PTCDA capped cells is increased due to increased PTCDA transparency and reduced surface recombination. When δ=10 nm, the EQE is significantly decreased in the PTCDA absorption region between λ=420 nm and 580 nm. Measurements of PTCDA PL on quartz substrates indicate that excitons generated in PTCDA are quenched by ITO deposited on its surface, as inferred from the PL spectra for these samples in FIG. 11, inset. To reduce quenching, a bathocuproine (BCP) or $MoO_3$ exciton blocking layer (EBL) is sandwiched between the PTCDA and the ITO cathode, resulting in a significant increase in PTCDA PL intensity. When BCP is employed in a window layer solar cell, the EQE loss at λ=480 nm disappears, whereas the use of $MoO_3$ results in a peak at this wavelength that corresponds to the PTCDA absorption maximum. These results indicate that excitons in an organic (e.g. PTCDA) can dissociate at its interface with an inorganic semiconductor (InP), ultimately contributing to an increased solar cell efficiency beyond that obtained with a conventional, "passive" window layer.

The stability of the PTCDA-InP devices has not been systematically tested, although we see no degradation in performance after exposure to air for several days. This is consistent with the observation that PTCDA is a highly stable organic compound.

In summary, it has been discovered that PTCDA can be used as a window layer that both decreases the recombination rate while generating photocurrent due to exciton dissociation at the InP surface in an ITO/PTCDA/InP solar cell. The solar cell power conversion efficiency is increased from 13.2±0.5% to 15.4±0.4% by using a 4 nm thick PTCDA window layer, largely due to a concomitant increase in $V_{OC}$ that arises from neutralizing InP surface states.

As generally discussed herein, and specifically exemplified in the above Example, organic materials can be used as window layer for inorganic solar cells. The $V_{OC}$ of p-InP Schottky barrier solar cell is enhanced by using PTCDA as a window layer. Without being bound by any theory, the effect is attributed to at least the foregoing: 1) PTCDA creates a hole energy barrier to suppress the forward hole thermionic emission dark current, 2) PTCDA helps to direct photo-generated holes to $p^+$-InP substrate at voltages near $V_{OC}$, 3) PTCDA window layer reduces the carrier recombination and enhances the carrier lifetime, and 4) PTCDA interfacial layer enhances the Schottky barrier height.

Comparing with inorganic window layers, the organic materials have several advantages. Organic materials can be more easily deposited using thermal evaporation or solution processing. Organic materials also have a large variety of energy levels, which can fit the requirements in solar cells with different materials and structures, where inorganic semiconductors and dielectrics sometimes cannot satisfy. For example, there is no good window layer for p-InP Schottky barrier solar cell. $In_{0.52}Al_{0.48}As$ has a slightly larger bandgap, but it is not suitable for p-InP Schottky barrier solar cell, since it forms a electron energy barrier and a hole sink at the interface with InP. PTCDA has a much more suitable energy level as a window layer in this case.

Unless otherwise indicated, all numbers expressing quantities of ingredients, reaction conditions, and other properties or parameters used in the specification are to be understood as being modified in all instances by the term "about." Accordingly, unless otherwise indicated, it should be understood that the numerical parameters set forth in the following specification and attached claims are approximations. At the very least, and not as an attempt to limit the application of the doctrine of equivalents to the scope of the claims, numerical parameters should be read in light of the number of reported significant digits and the application of ordinary rounding techniques.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A device comprising:
    an anode;
    a cathode;
    an inorganic substrate positioned between the anode and the cathode; and
    at least one organic window layer positioned between:
        said anode and said inorganic substrate; or
        said cathode and said inorganic substrate,
    wherein the at least one organic window layer has a thickness that is no greater than 25 nm, and
    wherein the device exhibits an enhanced Schottky barrier height when compared to the device without the at least one organic window layer.

2. The device of claim 1, wherein said device exhibits one or more of the following characteristics when compared to the device without said at least one organic window layer:
    increased $V_{OC}$ at one sun AM1.5G illumination;
    increased power conversion at one sun AM1.5G illumination; or
    reduced forward dark current.

3. The device of claim 1, further comprising at least one inorganic epilayer located on said inorganic substrate.

4. The device of claim 3, further comprising at least one inorganic buffer layer positioned between said inorganic substrate and said at least one inorganic epilayer.

5. The device of claim 3, wherein said organic window layer is located between:
    said anode and said inorganic epilayer; or
    said cathode and said inorganic epilayer.

6. The device of claim 1, wherein said anode comprises a semiconductor material chosen from a p-type or n-type semiconductor.

7. The device of claim 6, wherein said anode comprises ITO.

8. The device of claim 1, wherein said cathode comprises one or more materials sufficient to make ohmic contact with a semiconductor material.

9. The device of claim 8, wherein said materials sufficient to make ohmic contact with a semiconductor material are selected from Zn, Au, Al, Ag, alloys thereof, and stacks thereof.

10. The device of claim 1, wherein said inorganic substrate comprises a semiconducting material.

11. The device of claim 10, wherein said semiconducting material is selected from Ge, Si, GaAs, InP, GaN, AlN, CdTe, ZnTe, copper indium gallium (di)selenide (CIGS), and combinations thereof.

12. The device of claim 3, wherein said at least one inorganic epilayer comprises at least one group III-V material, Ge, Si, GaAs, InP, GaN, AlN, CdTe, ZnTe, copper indium gallium (di)selenide (CIGS), and combinations thereof.

13. The device of claim 12, wherein said at least one inorganic epilayer comprises at least one material selected from GaAs and InP.

14. The device of claim 4, wherein said at least one inorganic buffer layer comprises at least one group III-V material.

15. The device of claim 14, wherein said at least one inorganic buffer layer comprises at least one material selected from GaAs and InP.

16. The device of claim 1, wherein said at least one organic window layer comprises 3,4,9,10-Perylenetetracarboxylic dianhydride (PTCDA) or naphthalene tetracarboxylic anhydride (NTCDA).

17. The device of claim 1, wherein said device is a Schottky barrier solar cell.

18. A method of enhancing the performance of a photosensitive device having an anode, a cathode, an inorganic substrate, said method comprising:
    positioning at least one organic window layer between:
        said anode and said inorganic substrate; and/or
        said cathode and said inorganic substrate wherein the at least one organic window layer has a thickness that is no greater than 25 nm.

19. The method of claim 18, wherein said device exhibits one or more of the following characteristics when compared to the device without said at least one organic window layer:
    increased $V_{OC}$ at one sun AM1.5G illumination;
    increased power conversion at one sun AM1.5G illumination;
    enhanced Schottky barrier height; or
    reduced forward dark current.

20. The method of claim 18, further comprising at least one inorganic epilayer located on said inorganic substrate.

21. The method of claim 20, further comprising positioning at least one inorganic buffer layer between said inorganic substrate and said at least one inorganic epilayer.

22. The method of claim 21, further comprising position said organic window layer between:
    said anode and said inorganic epilayer; and/or
    said cathode and said inorganic epilayer.

23. The method of claim 18, wherein said anode comprises a semiconductor material, chosen from a p-type or n-type semiconductor material.

24. The method of claim 23, wherein said anode comprises ITO.

25. The method of claim 18, wherein said cathode comprises one or more materials selected from Zn, Au, Al, Ag, alloys thereof, and stacks thereof.

26. The method of claim 18, wherein said inorganic substrate comprises a material selected from Ge, Si, GaAs, InP, GaN, AlN, CdTe, ZnTe, copper indium gallium (di)selenide (CIGS), and combinations thereof.

27. The method of claim 18, wherein said at least one inorganic epilayer comprises at least one group III-V material, Ge, Si, GaAs, InP, GaN, AlN, CdTe, ZnTe, copper indium gallium (di)selenide (CIGS), and combinations thereof.

28. The method of claim 21, wherein said at least one inorganic buffer layer comprises at least one group III-V material selected from GaAs and InP.

29. The method of claim 18, wherein said at least one organic window layer comprises 3,4,9,10-Perylenetetracarboxylic dianhydride (PTCDA) or naphthalene tetracarboxylic anhydride (NTCDA).

30. The method of claim 18, wherein the organic window layer absorbs light and generate excitons that migrate to the inorganic portion of the device.

31. The method of claim 30, wherein the generated excitons convert to photocurrent.

32. A method of enhancing Schottky barrier height of a photosensitive device comprising an anode, a cathode, and an inorganic substrate, said method comprising:

positioning at least one organic window layer between:
- said anode and said inorganic substrate; and/or
- said cathode and said inorganic substrate;

wherein said device exhibits one or more of the following characteristics when compared to the device without said at least one organic window layer:
- increased $V_{OC}$ at one sun AM1.5G illumination;
- increased power conversion at one sun AM1.5G illumination; or
- reduced forward dark current; wherein the at least one organic window layer has a thickness that is no greater than 25 nm.

33. A device comprising:
an anode;
a cathode;
an inorganic substrate positioned between the anode and the cathode; and
at least one organic window layer positioned between the anode and the inorganic substrate or the cathode and the inorganic substrate,
wherein the at least one organic window layer has a thickness that is no greater than 25 nm.

34. The device of claim 33, wherein the device exhibits one or more of the following characteristics when compared to the device without the at least one organic window layer:
- increased $V_{OC}$ at one sun AM1.5G illumination;
- increased power conversion at one sun AM1.5G illumination;
- enhanced Schottky barrier height; and
- reduced forward dark current.

35. The device of claim 33, wherein the at least one organic window layer comprises PTCDA or NTCDA.

* * * * *